United States Patent
Bombal et al.

[11] Patent Number: 6,141,782
[45] Date of Patent: Oct. 31, 2000

[54] PSEUDO-SCAN TESTING USING HARDWARE-ACCESSIBLE IC STRUCTURES

[75] Inventors: Jerome Bombal, La Trinite; Laurent Souef, Mouans Sartoux, both of France

[73] Assignee: VLSI Technology, Inc., San Jose, Calif.

[21] Appl. No.: 09/052,796

[22] Filed: Mar. 31, 1998

[51] Int. Cl.[7] .................................................. G01R 31/28
[52] U.S. Cl. .......................................... 714/738; 714/728
[58] Field of Search ................................... 714/738, 739, 714/726, 728, 724

[56] References Cited

U.S. PATENT DOCUMENTS

| | | | |
|---|---|---|---|
| 5,696,771 | 12/1997 | Beausang et al. | 714/724 |
| 5,703,789 | 12/1997 | Beausang et al. | 364/489 |
| 5,903,466 | 5/1999 | Beausang et al. | 364/488 |

*Primary Examiner*—Albert De Cady
*Assistant Examiner*—Esaw Abraham
*Attorney, Agent, or Firm*—Burns Doane Swecker & Mathis L.L.P.

[57] ABSTRACT

The present invention, generally speaking, provides an integrated circuit testing technique in which hardware accessibility of selected components is exploited in order to avoid scan insertion overhead but achieve as good or better fault coverage than if scan insertion had been used. The term "pseudo-scan" is used to refer to the use of read and write instructions to achieve the equivalent effect as scan insertion without the addition of scan flops. Existing ATPG tools may be used without modification by performing scan insertion on a "dummy" circuit and performing ATPG on the scan-augmented dummy circuit. The resulting ATPG vectors are then modified to perform pseudo scan of selected components of the original circuit.

2 Claims, 6 Drawing Sheets

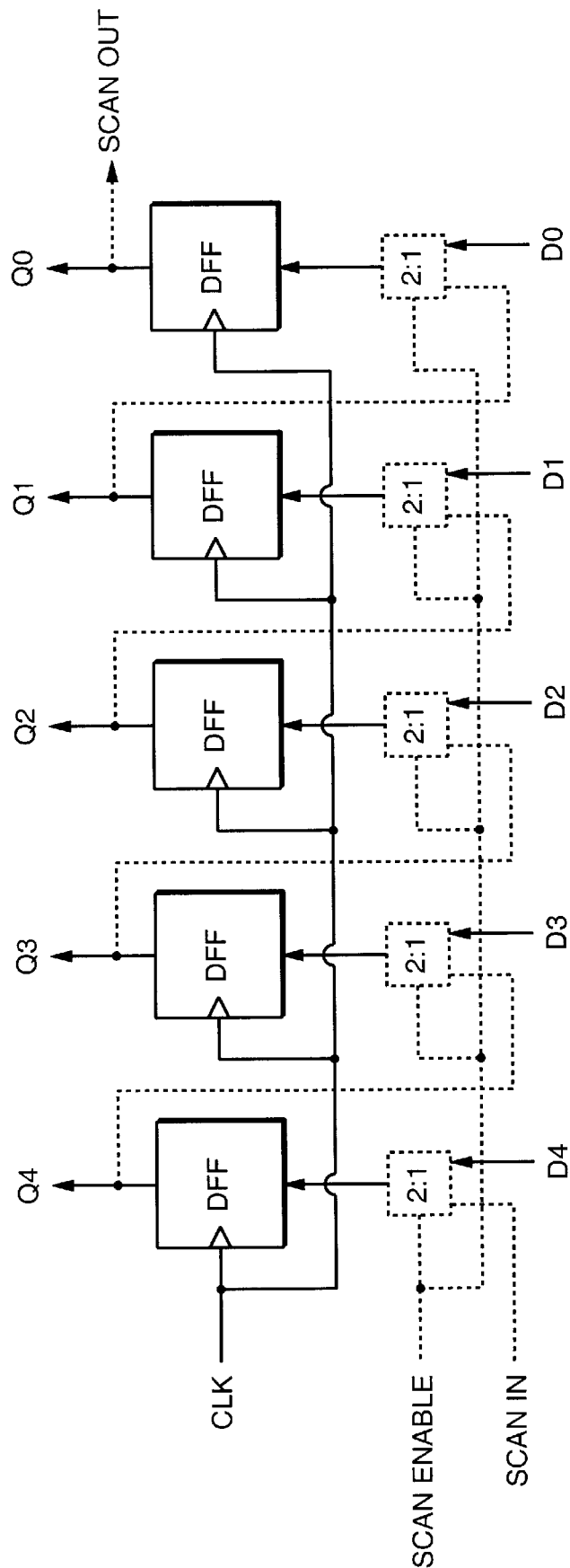
FIG._1

| Signal | Scan parallel i/o vector 1 | Scan parallel i/o vector 2 | Scan parallel i/o vector 3 | "Capture" vector 1 | "Capture" vector 2 | "Capture" vector 3 | Scan parallel i/o vector 1 | Scan parallel i/o vector 2 | Scan parallel i/o vector 3 | "Capture" vector 1 | "Capture" vector 2 | "Capture" vector 3 | |
|---|---|---|---|---|---|---|---|---|---|---|---|---|---|
| scan_mode   | 1 | 1 | 1 | 0 | 0 | 0 | 1 | 1 | 1 | 0 | 0 | 0 | |
| scan_io[0]  | 0 | 0 | 0 | 0 | 0 | 0 | 0 | 0 | 0 | 0 | 0 | 0 | |
| scan_io[1]  | 1 | 1 | 1 | 1 | 1 | 1 | 1 | 1 | 1 | 1 | 1 | 1 | |
| scan_io[2]  | 0 | 0 | 0 | 0 | 0 | 0 | 1 | 1 | 1 | 0 | 0 | 0 | |
| scan_io[3]  | 1 | 1 | 1 | 1 | 1 | 1 | 1 | 1 | 1 | 0 | 0 | 0 | |
| scan_io[4]  | 0 | 0 | 0 | 0 | 0 | 0 | 0 | 0 | 0 | 1 | 1 | 1 | etc. |
| input[0]    | 0 | 0 | 0 | 0 | 0 | 0 | 0 | 0 | 0 | 0 | 0 | 0 | |
| input[1]    | 0 | 0 | 0 | 1 | 1 | 1 | 0 | 0 | 0 | 1 | 1 | 1 | |
| input[2]    | 0 | 0 | 0 | 0 | 0 | 0 | 0 | 0 | 0 | 1 | 1 | 1 | |
| data[0]     | 0 | 0 | 0 | 1 | 1 | 1 | 0 | 0 | 0 | 1 | 1 | 1 | |
| data[1]     | 0 | 0 | 0 | 1 | 1 | 1 | 0 | 0 | 0 | 1 | 1 | 1 | |
| data[2]     | 0 | 0 | 0 | 0 | 0 | 0 | 0 | 0 | 0 | 0 | 0 | 0 | |
| data[3]     | 0 | 0 | 0 | 0 | 0 | 0 | 0 | 0 | 0 | 1 | 1 | 1 | |
| data[4]     | 0 | 0 | 0 | 0 | 0 | 0 | 0 | 0 | 0 | 0 | 0 | 0 | |
| add[0]      | 0 | 0 | 0 | 0 | 0 | 0 | 0 | 0 | 0 | 0 | 0 | 0 | |
| add[1]      | 0 | 0 | 0 | 0 | 0 | 0 | 0 | 0 | 0 | 0 | 0 | 0 | |
| add[2]      | 0 | 0 | 0 | 1 | 1 | 1 | 0 | 0 | 0 | 1 | 1 | 1 | |
| add[3]      | 0 | 0 | 0 | 0 | 0 | 0 | 0 | 0 | 0 | 1 | 1 | 1 | |
| add[4]      | 0 | 0 | 0 | 0 | 0 | 0 | 0 | 0 | 0 | 0 | 0 | 0 | |
| chip_select | 0 | 0 | 0 | 0 | 0 | 0 | 0 | 0 | 0 | 1 | 1 | 1 | |
| write       | 0 | 0 | 0 | 1 | 1 | 1 | 0 | 0 | 0 | 0 | 0 | 0 | |
| clock       | 0 | 0 | 0 | 0 | 0 | 0 | 0 | 0 | 0 | 0 | 1 | 0 | |

|  | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* "Capture" vector 1 */ | /* "Capture" vector 2 */ | /* "Capture" vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ | /* Scan parallel i/o vector 1 */ | /* Scan parallel i/o vector 2 */ | /* Scan parallel i/o vector 3 */ |
|---|---|---|---|---|---|---|---|---|---|---|---|---|---|---|---|---|---|---|---|---|---|---|---|---|---|---|---|---|---|---|---|---|---|

(Table of scan test vector values — binary 0/1 data for signals: scan_out, scan_in, scan_mode, scan_io[0..4], input[0..2], data[0..4], add[0..4], chip_select, write, clock. See figure for complete binary pattern.) etc.

```
                                                    /* Read from register add 11001 vector 1 */
                                                    /* Read from register add 11001 vector 2 */
                                                    /* Read from register add 11001 vector 3 */
                                                    /* Write in register add 11001, value 01010, vector 1 */
                                                    /* Write in register add 11001, value 01010, vector 2 */
                                                    /* Write in register add 11001, value 01010, vector 3 */
                                                    /* "Capture" vector 1 */
                                                    /* "Capture" vector 2 */
                                                    /* "Capture" vector 3 */
                                                    /* Read from register add 11001 vector 1 */
                                                    /* Read from register add 11001 vector 2 */
                                                    /* Read from register add 11001 vector 3 */
                                                    /* Write in register add 11001, value 01110, vector 1 */
                                                    /* Write in register add 11001, value 01110, vector 1 */
                                                    /* Write in register add 11001, value 01110, vector 1 */ input[0]  0 0 0 0 0 0 0 0 0 0 0 0 0 0 0 0
    input[1]  0 0 0 0 0 0 0 1 1 1 0 0 0 0 0 0
    input[2]  0 0 0 0 0 0 0 0 0 0 0 0 0 0 0 0 data[0]   N N N 0 0 0 0 0 0 0 N N N 0 0 0       etc.
    data[1]   N N N 1 1 1 1 1 1 1 N N N 1 1 1
    data[2]   N N N 0 0 0 1 1 1 1 N N N 1 1 1
    data[3]   N N N 1 1 1 0 0 0 0 N N N 0 1 1
    data[4]   N N N 0 0 0 0 0 0 0 N N N 0 0 0 add[0]    1 1 1 1 1 1 1 0 0 0 1 1 1 1 1 1
    add[1]    0 0 0 0 0 0 0 0 0 0 0 0 0 0 0 0
    add[2]    0 0 0 0 0 0 1 1 1 1 0 0 0 0 0 0
    add[3]    1 1 1 1 1 1 1 0 0 0 1 1 1 1 1 1
    add[4]    1 1 1 1 1 1 1 0 0 0 1 1 1 1 1 1 chip_select 0 1 0 0 1 0 0 0 0 0 0 1 0 0 0 0
       write 0 0 0 1 1 1 1 1 1 1 0 0 0 1 1 1
       clock 0 0 0 0 0 0 0 1 0 0 0 0 0 0 1 0
```

FIG._4

Single Stuck-At-Fault Statistics:

Completed Fault List:
Detected Faults                              2882
Undetected Faults                            1698
Untestable Faults                             668
Total Faults                                 5248
(Potentially Detected Faults)                 242
Fault Coverage                             54.92 %
Testable Fault Coverage                    62.93 %
Efficiency                                 67.64 %

Collapsed Fault List:
Detected Faults                              2035
Undetected Faults                            1118
Untestable Faults                             411
Total Faults                                 3564
(Potentially Detected Faults)                 150
Fault Coverage                             57.10 %
Testable Fault Coverage                    64.54 %
Efficiency                                 68.63 %

FIG._5

Single Stuck-At-Fault Statistics:

Completed Fault List:
Detected Faults                              5057
Undetected Faults                             788
Untestable Faults                            1545
Total Faults                                 7390
(Potentially Detected Faults)                  38
Fault Coverage                             68.43 %
Testable Fault Coverage                    86.52 %
Efficiency                                 89.34 %

Collapsed Fault List:
Detected Faults                              3332
Undetected Faults                             583
Untestable Faults                            1293
Total Faults                                 5208
(Potentially Detected Faults)                  35
Fault Coverage                             63.98 %
Testable Fault Coverage                    85.11 %
Efficiency                                 88.81 %

FIG._6

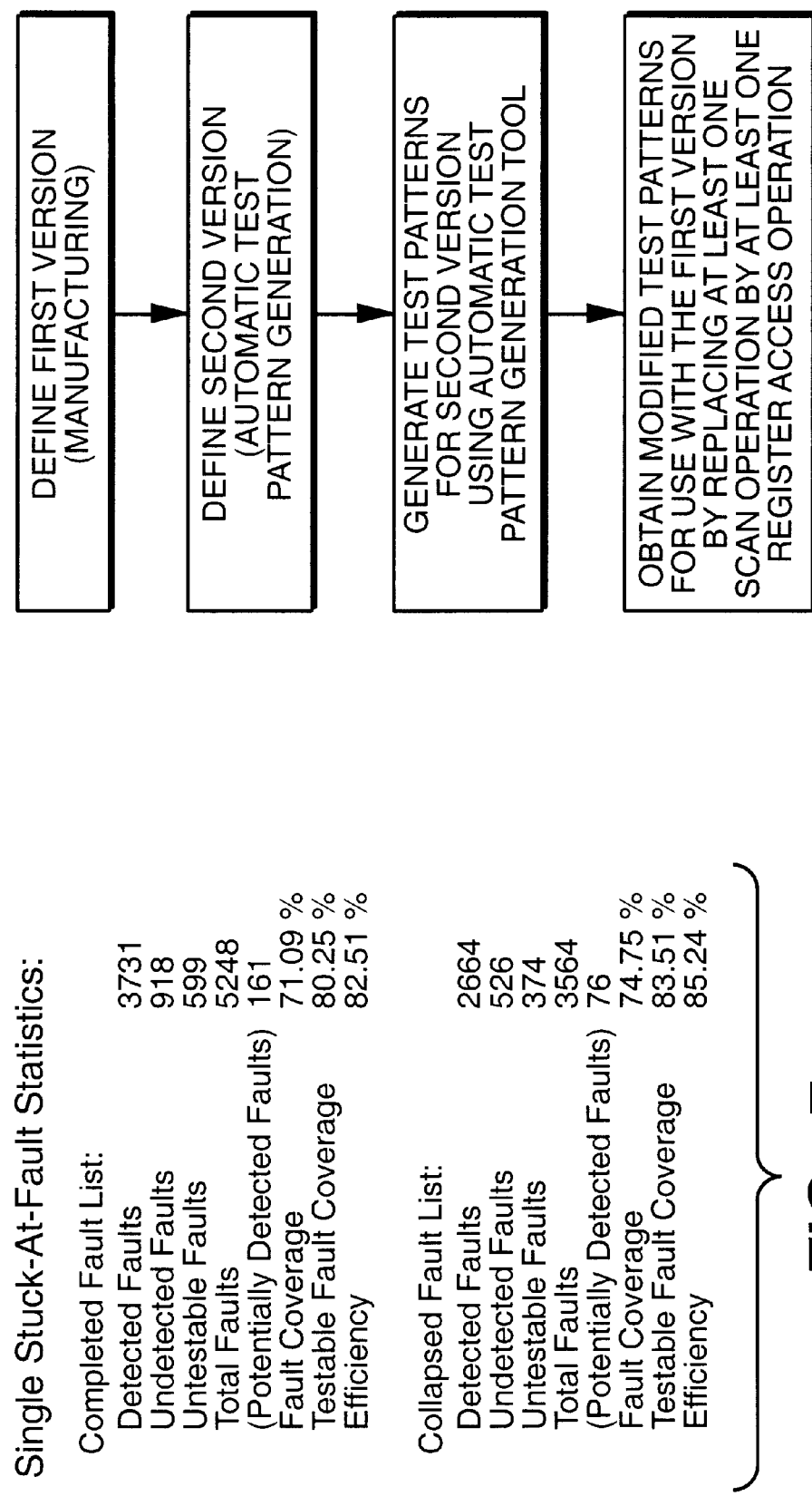

PSEUDO-SCAN TESTING USING HARDWARE-ACCESSIBLE IC STRUCTURES

BACKGROUND OF THE INVENTION

1. Field of the Invention

The present invention relates to integrated circuit testing, more particular to Automatic Test Pattern Generation (ATPG).

2. State of the Art

After fabrication, integrated circuits are tested by applying test patterns and observing response patterns. Rigorous testing of sequential circuits is difficult or impossible unless the integrated circuit is designed with testing in mind, so-called Design for Test, or DFT. A principal DFT technology is scan insertion. Scan insertion involves inserting scan flip flops into the circuit so as to enable the logic values of various internal nodes of the circuit to be set to known levels. Integrated circuit designs are described by netlists. During scan insertion, a modified netlists is generated in which scan flip flops ("scan flops") are added. Using scan insertion, a sequential circuit can, in effect, be partitioned into multiple combinatorial circuits, the inputs to which can be set by scan insertion and the outputs of which can be observed. Referring to FIG. 1, an example of scan insertion is shown. An integrated circuit is assumed to have a register of some number of bits, e.g., five. During scan insertion, scan flops are inserted, e.g., five flip flops, one corresponding to each register bit. For reasons made clear below, the scan flops are shown in dotted lines.

Following scan insertion, ATPG is performed using an ATPG tool. ATPG tools are offered by serveral commercial vendors. One popular tool is the Sunrise™ ATPG tool. During ATPG, circuit simulation is performed to arrive at an efficient set of test vectors for the integrated circuit that result in high fault coverage (e.g., 80–90%) for various categories of faults. Fault coverage refers to the percentage of possible faults that are tested by the set of test vectors. Because testing for some faults would inordinately increase the amount of testing required, 100% fault coverage is rarely achieved.

Scan insertion increases circuit size and power consumption, and may impact circuit performance. What is needed is a technique that avoids some of the overhead of scan insertion but that achieves as good or better fault coverage than if scan insertion had been used.

SUMMARY OF THE INVENTION

The present invention, generally speaking, provides an integrated circuit testing technique in which hardware accessibility of selected components is exploited in order to avoid scan insertion overhead but achieve as good or better fault coverage than if scan insertion had been used. The term "pseudo-scan" is used to refer to the use of read and write instructions to achieve the equivalent effect as scan insertion without the addition of scan flops. Existing ATPG tools may be used without modification by performing scan insertion on a "dummy" circuit and performing ATPG on the scan-augmented dummy circuit The resulting ATPG vectors are then modified to perform pseudo scan of selected components of the original circuit.

BRIEF DESCRIPTION OF THE DRAWING

The present invention may be further understood from the following description in conjunction with the appended drawing. In the drawing:

FIG. 1 is a block diagram showing an example of scan insertion;

FIG. 2 is a table of parallel test vectors corresponding to the example of FIG. 1;

FIG. 3 is a table of serialized test vectors corresponding to the example of FIG. 1;

FIG. 4 is a table of modified parallel test vectors corresponding to the example of FIG. 1;

FIG. 5 is a table showing fault coverage of an original circuit using a conventional ATPG tool without pseudo-scan;

FIG. 6 is a table showing fault coverage of a scan-augmented circuit using the same ATPG tool without pseudo-scan;

FIG. 7 is a table showing fault coverage of the original circuit using pseudo-scan; and FIG. 8 is a flow diagram showing a method of generating test patterns for an integrated circuit in accordance with the invention.

DETAILED DESCRIPTION OF THE PREFERRED EMBODIMENTS

The test method described herein is based on direct access of registers by an ATPG tool rather than scan. If a given register in any circuit can be read from and written to through normal chip I/O, then a proper declartion of the properties of, this particular register can be used by any ATPG tool to propagate values into and from these register flip-flops in the same way as in a scan chain, i.e., in a purely "mechanical" way, without any knowledge on the part of the ATPG tool of what the netlists structure is.

In an exemplary embodiment, the test method of the present invention involves the following steps:

Identify accessible registers, along with the correct sequence to read and write.

Create a modified circuit database with the above registers replaced by the usual scan elements.

Run the ATPG on this scan database and generate parallel vectors.

Run a program to modify the parallel vectors in accorance with a register identification file.

Perform fault simulation of the modified vectors to ensure that the new patterns behave properly and that fault coverage is not decreased.

Reformat the vectors from the ATPG format to the hardware tester format.

Consider a very simple example of a single five-bit register at address 1100. The register is shown in solid lines in FIG. 1. Components added by scan insertion are shown in dotted lines. Running an ATPG tool on the scan-augmented circuit results in the parallel (non-serialized) vectors shown in FIG. 2. A typical ATPG tool provides for a configurable number of time frames per cycle. In the example of FIG. 2, there are three different time frames per cycle. A cycle is related to the main clock duration. Each line in FIG. 2 is called a vector. In the example of FIG. 2, there are three different time frames per cycle, and the clock has a 0 value in the first vector, a 1 value in the second vector, and a 0 value again in the third vector.

In the pattern sequence, scan mode and "capture" mode alternate. During scan mode, known values are scanned into the circuit. During capture mode, all of the flops sample data coming from the function design itself rather than a data value coming from the previous flop in the scan chain.

The corresponding serialized test vectors are shown in FIG. 3. Notice that the capture sequences are unchanged from the parallel vectors. In the case of the scan vectors, whereas there were previously three parallel vectors per scan sequence, there are now five groups of three serial vectors each per scan sequence. This is because, in the chosen example, there are five scan flops (all related in this case to the same five-bit register), and the scan chain must be shifted five time to propagate new values to the flops through the scan_in input and observe the previous value through the scan_out output.

An important aspect of the present invention is to cause the ATPG tool to generate test patterns assuming scan access, then to modify the vectors to take advantage of existing register access capabilities of the circuit, thereby obviating the need to add actual scan circuitry. To cause the ATPG tool to generate test patterns assuming scan access, the circuit netlists may be modified by scan insertion. Alternatively, a modified netlists need not actually be created. Instead, in some ATPG tool environments such as the Sunrise™ ATPG environment, the related flop properties may be modified through a configuration file more easily than creating a modified netlists.

After the ATPG tool has been run, the generated vectors are input to a computer program, together with a register identification file. The program produces modified vectors in which selected scan operations are replaced by "pseudo-scan" operations, i.e., register accesses. The modified vectors for the previous example are shown in FIG. 4. Note that a scan sequence is replaced by a read operations followed by a write operation. A write operation to a register control the flop values, and a read operation observe the flop values on an external data bus. It is necessary to first read (observe) the value that was present in the flop before writing a new value, which will be observed in next read cycle. During a read cycle, the data bus lines are not driven. Hence, the data inputs data[4:0] are represented symbolically by ZZZZZ, as being in a high-impedance state.

In FIG. 4, scan-related bits are not present, since scan capabilities are not present in the actual circuit to be tested.

Operation of a computer program for modifying the vectors generated by the ATPG tool will be described. In general, operation of the computer program is described by the following pseudo-code:

For each "scan" group of vectors
   If the group of vectors pertains to a register within the register file
      Replace the group of vectors with a pseudo-scan operation in which:
         1. Address and control signals are set in order to first read the register;
         2. Address, data and control signals are set in order to then write the register; and
         3. The data value written to the register is obtained from the group of vectors being replaced.

In practice, a "scan" group consisting of N vectors is replaced with two groups of N vectors each, a read group and a write group. Referring to FIG. 2 and FIG. 4, FIG. 2 contains a first scan group of three vectors and a second scan group of three vectors. In FIG. 4, the first scan group of three vectors is replaced by a read group of three vectors and a write group of three vectors. The second scan group of three vectors is replaced by a read group of three vectors and a write group of three vectors.

In one example, the foregoing pseudo-scan methodology was used on a 2500 gate design, in particular an Automatic Gain Control (AGC) block having 17 registers each accessible by setting an address bus, a data bus, a read/write signal and a select signal. Single stuck-at fault statistics obtained using the Sunrise ATPG tool on the non-scan netlist in the standard flow are shown in FIG. 5. Corresponding results obtained on the scan netlist using the standard flow are shown in FIG. 6. Finally, corresponding results obtained on the non-scan netlist using reformatted vectors in accordance with the present pseudo-scan methodology are shown in FIG. 7.

Comparison of data from the foregoing figures shows that the pseudo-scan results are far better than those obtained by the same ATPG tool using a conventional methodology on the same non-scan netlist, and are even better than those of the same ATPG tool used on the scan netlist. (This improved performance relative to the scan netlist may be attributed to extra activity generated by the reading/writing of registers that also serves to test some part of the decoding and glue logic of the circuit.)

Note that in the example described, registers constitute only part of the sequential elements of the circuit In this case, test of other sequential structure (counters, etc.) is achieved using conventional scan techniques or other DFT methods in order to achieve higher fault coverage with respect to non-registered flip-flops.

In many cases, test of other sequential structures may even be achieved using the method of the present invention. Consider for example a non-scanned asynchronous counter. Such a counter is very difficult for the ATPG to test because it would require a very large "sequential depth." A 10-bit counter, for example, would require the ATPG to anticipate the last flop behavior 1024 clock cycles in advance. This level of testing is beyond the capabilities of state-of-the-art tools.

Instead, the non-scan counter flops may be declared as scan flops in the same manner as pseudo-scan registers. The ATPG tool may then be used to generate test patterns for the resulting scan flops and the generated test patterns may be reformatted to add the required number of clock cycles. In this manner, the non-scan counter may be placed in the desired state.

Assume, for example, that the ATPG tool wants to put the counter into the state 1010101010. This value would then appear in the parallel vector scan information output by the ATPG tool The patterns would then be reformatted to apply 682 clock pulses (the decimal equivalent of the foregoing binary value) to the original non-scan counter. As a result, the counter would be set to 682, the value expected by the counter.

The present pseudo-scan methodology not only improves the circuit itself and its testability, it also reduces the number of vectors, contributing to time savings during test. For example, in the case of 8-bit registers, the conventional scan methodology requires 8 clock cycles to shift the data. In the pseudo-scan method, only one read and one write cycle are required, one-fourth the number of clock cycles. In the case of 16- or 32-bit registers, the ratio becomes ⅛ or ¹⁄₁₆.

The present pseudo-scan method is not only applicable to flip-flop-based register designs but is also well-suited to latch-based registers designs which cannot be tested using conventional scan techniques Latch-based register designs are increasingly used because of their advantages in terms of gate count and power consumption.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of generating test patterns for an integrated circuit designed to include multiple pin-accessible registers, comprising the steps of:

defining different versions of an integrated circuit design including a first version to be manufactured and a second version for use in automatic test pattern generation, wherein for at least some circuit elements, the second version includes test circuitry for circuit element and the first version does not;

using an automatic test pattern generation tool, generating test patterns for the second version of the integrated circuit design; and obtaining modified test patterns for use with the first version of the integrated circuit design by modifying the test patterns to replace at least one scan operation, in which data is loaded serially into a circuit element, by at least one register access operation, in which data is loaded in parallel into that circuit element.

2. The method of claim 1, wherein modifying the test patterns is performed using a register identification file.

* * * * *